US007947519B2

(12) United States Patent
Lee et al.

(10) Patent No.: US 7,947,519 B2
(45) Date of Patent: May 24, 2011

(54) TOP EMISSION ORGANIC LIGHT EMITTING DIODE DISPLAY USING AUXILIARY ELECTRODE TO PREVENT VOLTAGE DROP OF UPPER ELECTRODE AND METHOD OF FABRICATING THE SAME

(75) Inventors: Kwan-Hee Lee, Suwon-si (KR); Eun-Ah Kim, Suwon-si (KR); Chang-Su Seo, Suwon-si (KR); Moon-Hee Park, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 295 days.

(21) Appl. No.: 12/195,355

(22) Filed: Aug. 20, 2008

(65) Prior Publication Data

US 2008/0311692 A1 Dec. 18, 2008

Related U.S. Application Data

(62) Division of application No. 11/101,176, filed on Apr. 6, 2005, now Pat. No. 7,427,783.

(30) Foreign Application Priority Data

Apr. 7, 2004 (KR) ........................ 10-2004-0023900
Apr. 8, 2004 (KR) ........................ 10-2004-0024016

(51) Int. Cl.
*H01L 21/00* (2006.01)

(52) U.S. Cl. ............ 438/34; 438/128; 438/149; 257/59; 257/72; 257/40; 257/E51.019; 257/E33.062; 257/E33.065

(58) Field of Classification Search .................... 438/34, 438/128, 149; 257/59, 72, 40, E51.019, E33.062, 257/E33.065
See application file for complete search history.

(56) References Cited

U.S. PATENT DOCUMENTS 6,768,257 B1 7/2004 Yamada et al.
6,798,132 B2 9/2004 Satake
6,900,470 B2 5/2005 Kobayashi et al.
6,917,160 B2 7/2005 Koo et al.
6,933,672 B2 8/2005 Hosokawa
7,098,069 B2 8/2006 Yamazaki et al.
7,173,373 B2 2/2007 Yamada et al.
2004/0160170 A1 8/2004 Sato et al.
2005/0077816 A1* 4/2005 Yamada et al. ............... 313/503

OTHER PUBLICATIONS

Terada, et al., "54.5L: Late-News Paper: A 24-inch AM-OLED Display with XGA Resolution by Novel Seamless Tiling Technology" SID Symposium Digest 34, 2003, pp. 1463-1465.

* cited by examiner

*Primary Examiner* — Tu-Tu V Ho
(74) *Attorney, Agent, or Firm* — Christie, Parker & Hale, LLP

(57) ABSTRACT

An organic light emitting diode (OLED) display. The OLED display includes: a lower electrode formed on a layer on an insulating substrate having a thin film transistor. The lower electrode is electrically connected to the thin film transistor. An auxiliary electrode is formed on the same layer as the lower electrode, and a pixel defining layer is formed on edges of the lower electrode, thereby defining an opening which exposes a portion of the lower electrode. An organic layer is formed on the portion of the lower electrode exposed by the opening, and an upper electrode is formed on an entire surface of the insulating substrate and electrically connected to the auxiliary electrode. An edge of the auxiliary electrode may have a taper angle of at least 90°.

5 Claims, 8 Drawing Sheets

TOP EMISSION ORGANIC LIGHT EMITTING DIODE DISPLAY USING AUXILIARY ELECTRODE TO PREVENT VOLTAGE DROP OF UPPER ELECTRODE AND METHOD OF FABRICATING THE SAME

CROSS-REFERENCE TO RELATED APPLICATION

This application is a divisional application of U.S. patent application Ser. No. 11/101,176, filed Apr. 6, 2005, which claims priority to and the benefit of Korean Patent Application No. 10-2004-0023900, filed Apr. 7, 2004, and Korean Patent Application No. 10-2004-0024016, filed Apr. 8, 2004, the entire contents of both of which are incorporated herein by reference.

BACKGROUND OF THE INVENTION

1. Field of the Invention

The present invention relates to an organic light-emitting diode (OLED) display and a method of fabricating the same. More particularly, the present invention relates to a top emission OLED display using an auxiliary electrode for preventing or reducing a voltage drop of an upper electrode such that the top emission OLED display may be large-sized and a method of fabricating the same.

2. Description of the Related Art

A conventional top emission active matrix organic light-emitting diode (AMOLED) display uses a transparent cathode electrode in order to emit light toward a sealing substrate.

In general, a transparent conductive material such as indium tin oxide (ITO) or indium zinc oxide (IZO) is mainly used as the transparent cathode electrode. However, in order to function as the cathode electrode, a metal material having a low work function is thinly deposited on one side of the transparent conductive layer that comes in contact with an organic layer to form a semitransparent metal layer, and then the ITO or IZO is thickly deposited on the semitransparent metal layer.

In the above process, since the ITO or IZO layer is formed after the organic layer is formed, the ITO or IZO layer should be formed by a low temperature deposition method in order to minimize damage of the organic layer due to heat or plasma. When the low temperature deposition method is used, however, the quality of the ITO or IZO layer is deteriorated and its specific resistance is increased.

When the specific resistance of the cathode electrode is increased, voltage differences are generated between near regions and far regions from a portion where a power source is input due to a voltage drop depending on positions of the pixels rather than uniformly applying a cathode voltage to all pixels. As a result, non-uniformity of brightness and image characteristics may be generated and power consumption may increase.

Also, due to the voltage drop, it is difficult to apply to a middle-sized or large-sized top emission AMOLED display.

In order to solve the above problem, Shoji Terada et al. introduced a method of forming an auxiliary electrode for preventing a voltage drop of an upper electrode on a pixel-defining layer 285 in "54.5L: Late-News Paper: A 24-inch AM-OLED Display with XGA Resolution by Novel Seamless Tiling Technology," SID Symposium Digest 34, 1463 (2003).

A conventional top emission OLED display will now be described with reference to the attached drawings.

FIG. 1 is a partial cross-sectional view of a conventional top emission OLED display, showing only a portion corresponding to a thin film transistor, a pixel electrode, and a capacitor.

Referring to FIG. 1, a buffer layer 110 is formed on an insulating substrate 100. An active layer 120 including source and drain regions 121 and 125 is formed on the buffer layer 110. A gate electrode 141 and a lower electrode 147 of a capacitor are formed on a gate-insulating layer 130. Formed on an interlayer insulating layer 150 are source and drain electrodes 161 and 165 connected to the source and drain regions 121 and 125 through contact holes 151 and 155, respectively, and an upper electrode 167 of the capacitor connected to one of the source and drain electrodes 161 and 165, for example, the source electrode 161.

A passivation layer 170 is formed on the entire surface of the insulating substrate 100. A lower electrode 180, i.e., a pixel electrode, is formed on the passivation layer 170 as an anode electrode of an electroluminescent (EL) device connected to one of the source and drain electrodes 161 and 165, for example, the drain electrode 165, through a via hole 175. A pixel defining layer 185 having an opening 189 which exposes a portion of the lower electrode 180 is formed. An organic layer 190 is formed on the lower electrode 180 in the opening 189. Then, an auxiliary electrode 193 for preventing a voltage drop of an upper electrode is formed on the pixel defining layer 185, and an upper electrode 195 serving as a cathode electrode is formed on the entire surface of the insulating substrate 100.

However, according to the above method, in a process of forming the auxiliary electrode 193, when a semitransparent metal layer used as the auxiliary electrode 193 is deposited and patterned on the pixel defining layer 185, the organic layer 190 may be damaged. Also, a masking process should be added to form the auxiliary electrode 193, which leads to the complication of the process.

SUMMARY OF THE INVENTION

The present invention, therefore, solves aforementioned problems associated with conventional displays by providing an organic light emitting diode (OLED) display using an auxiliary electrode to prevent or reduce a voltage drop of an upper electrode.

In exemplary embodiments of the present invention, a top emission OLED display capable of preventing or reducing a voltage drop of an upper electrode improves brightness and image characteristics such that the top emission OLED display can be large-sized.

According to an exemplary embodiment of the present invention, an OLED display includes: a lower electrode formed on a layer on an insulating substrate having a thin film transistor, the lower electrode being electrically connected to the thin film transistor; an auxiliary electrode formed on the same layer as the lower electrode; a pixel defining layer formed on edges of the lower electrode, thereby defining an opening which exposes a portion of the lower electrode; an organic layer formed on the portion of the lower electrode exposed by the opening; and an upper electrode formed on an entire surface of the insulating substrate and electrically connected to the auxiliary electrode.

An edge of the auxiliary electrode may have a taper angle of at least 90°. The edge of the auxiliary electrode may have a taper angle between 90° and 135°. The auxiliary electrode may prevent or reduce a voltage drop of the upper electrode.

The upper electrode may be electrically connected to the auxiliary electrode through at least one side of the auxiliary electrode.

The lower electrode and the auxiliary electrode may be made of a conductive material having a work function larger than that of a material of the upper electrode.

The lower electrode and the auxiliary electrode may be made of a material having low specific resistance and high reflectivity.

The lower electrode and the auxiliary electrode may be made of a single layer or a multilayer.

The lower electrode and the auxiliary electrode may be made of Al, Mo, MoW, Ti, Ag/ITO, Ag/Mow, or MoW/Al (Nd)/ITO.

The lower electrode and the auxiliary electrode may be thicker than the organic layer and may each have a thickness of at least 3,000 Å.

The auxiliary electrode may be arranged in a linear pattern.

The auxiliary electrode may be arranged in a grid pattern.

The auxiliary electrode may be connected to a cathode inlet terminal of a pad portion.

A top surface of the auxiliary electrode may have a length which is greater than or equal to that of a bottom surface of the auxiliary electrode.

The length of the top surface of the auxiliary electrode may have a range from a value equal to the length of the bottom surface of the auxiliary electrode to a sum of twice the thickness of the auxiliary electrode and the length of the bottom surface of the auxiliary electrode.

According to another exemplary embodiment of the present invention, a method of fabricating an OLED display includes: concurrently forming an auxiliary electrode and a lower electrode on an insulating substrate including a thin film transistor, the lower electrode being electrically connected to the thin film transistor; forming a pixel defining layer on edges of the lower electrode, thereby defining an opening which exposes a portion of the lower electrode; forming an organic layer on the portion of the lower electrode exposed by the opening; and forming an upper electrode on an entire surface of the insulating substrate, the upper electrode being electrically connected to the auxiliary electrode.

According to yet another exemplary embodiment of the present invention, an OLED display includes: a lower electrode formed on an insulating substrate having a thin film transistor, the lower electrode being electrically connected to the thin film transistor; an auxiliary electrode formed on the insulating substrate, the auxiliary electrode having an edge with a taper angle greater than 90°; a pixel defining layer formed on edges of the lower electrode, thereby defining an opening which exposes a portion of the lower electrode; an organic layer formed on the portion of the lower electrode exposed by the opening; and an upper electrode formed on an entire surface of the insulating substrate and electrically connected to the auxiliary electrode.

BRIEF DESCRIPTION OF THE DRAWINGS

The above and other features of the present invention will be described in reference to certain exemplary embodiments thereof with reference to the attached drawings in which.

DETAILED DESCRIPTION

Figure 1:
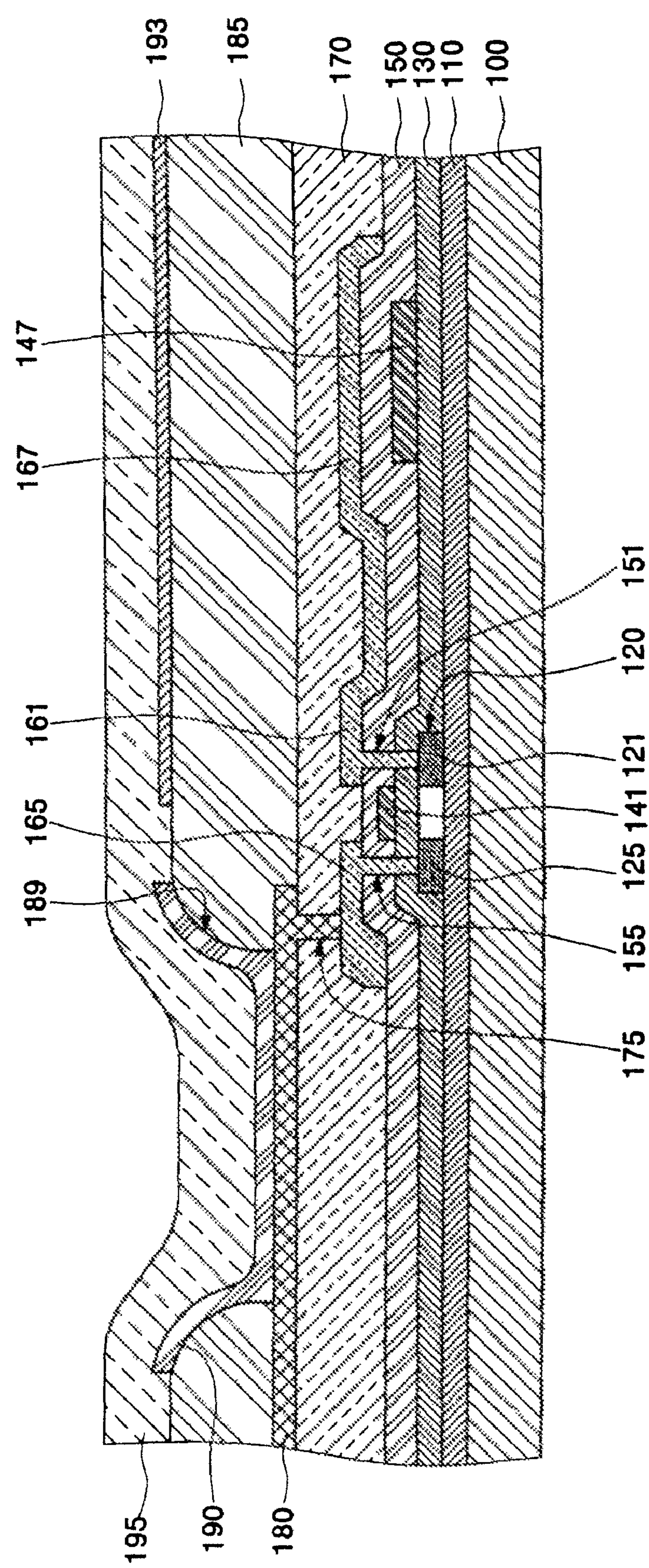
FIG. 1 is a partial cross-sectional view illustrating a conventional top emission organic light emitting diode (OLED) display.

The present invention will now be described more fully hereinafter with reference to the accompanying drawings, in which certain exemplary embodiments of the invention are shown. This invention may, however, be embodied in different forms and should not be construed as limited to the embodiments set forth herein. Like reference numerals refer to like elements throughout the specification. Also, when a layer is described as being formed on a substrate in this specification, the layer may be formed directly on the substrate, or it may be formed on the substrate with one or more other layers that are formed therebetween.

Figure 2:
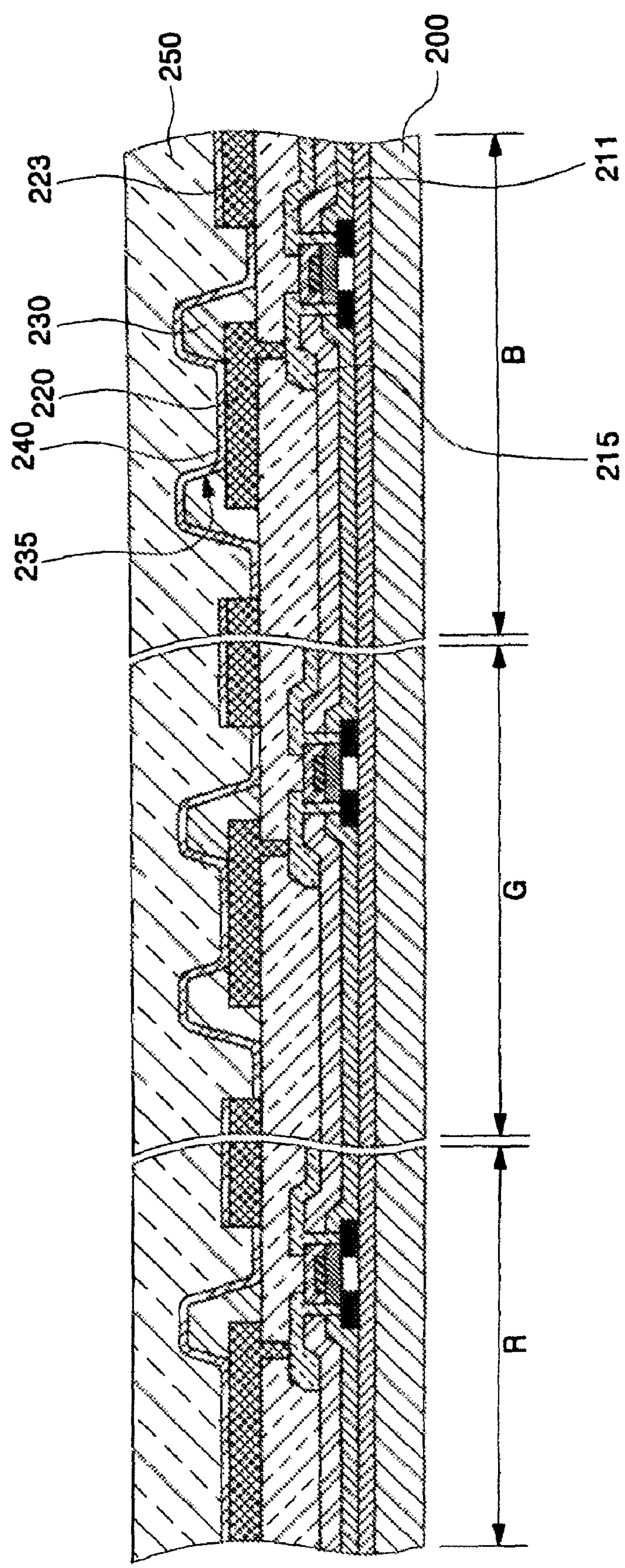
FIG. 2 is a partial cross-sectional view illustrating a top emission OLED display according to a first exemplary embodiment of the present invention.

FIG. 2 is a partial cross-sectional view that illustrates a top emission organic light emitting diode (OLED) display according to a first exemplary embodiment of the present invention, partially showing R, G, and B unit pixels of the top emission OLED display.

Referring to FIG. 2, an active matrix organic light emitting diode (AMOLED) display according to the first exemplary embodiment of the present invention includes a lower electrode 220 electrically connected to source and drain electrodes 211 and 215 of a thin film transistor on an insulating substrate 200 per each R, G, and B pixel, and an auxiliary electrode 223 for preventing or reducing a voltage drop of an upper electrode. The auxiliary electrodes 223 are formed between the lower electrodes 220 of the R, G, and B pixels and on the same layer as the lower electrodes 220.

Also, the AMOLED display includes a pixel defining layer 230 formed only on an edge of the lower electrode 220 other than the auxiliary electrode 223 to be separated by each R, G, and B pixel and to form an opening 235 that exposes a portion of the lower electrode 220.

Also, the AMOLED display includes an organic layer 240 formed on the lower electrode 220 exposed by the opening 235 and the pixel defining layer 230. The organic layer 240 is not formed on at least one side of the auxiliary electrode 223.

Also, the AMOLED display includes an upper electrode 250 formed on the entire surface of the insulating substrate 200 and electrically connected to at least one side of the auxiliary electrode 223.

Figure 3A:
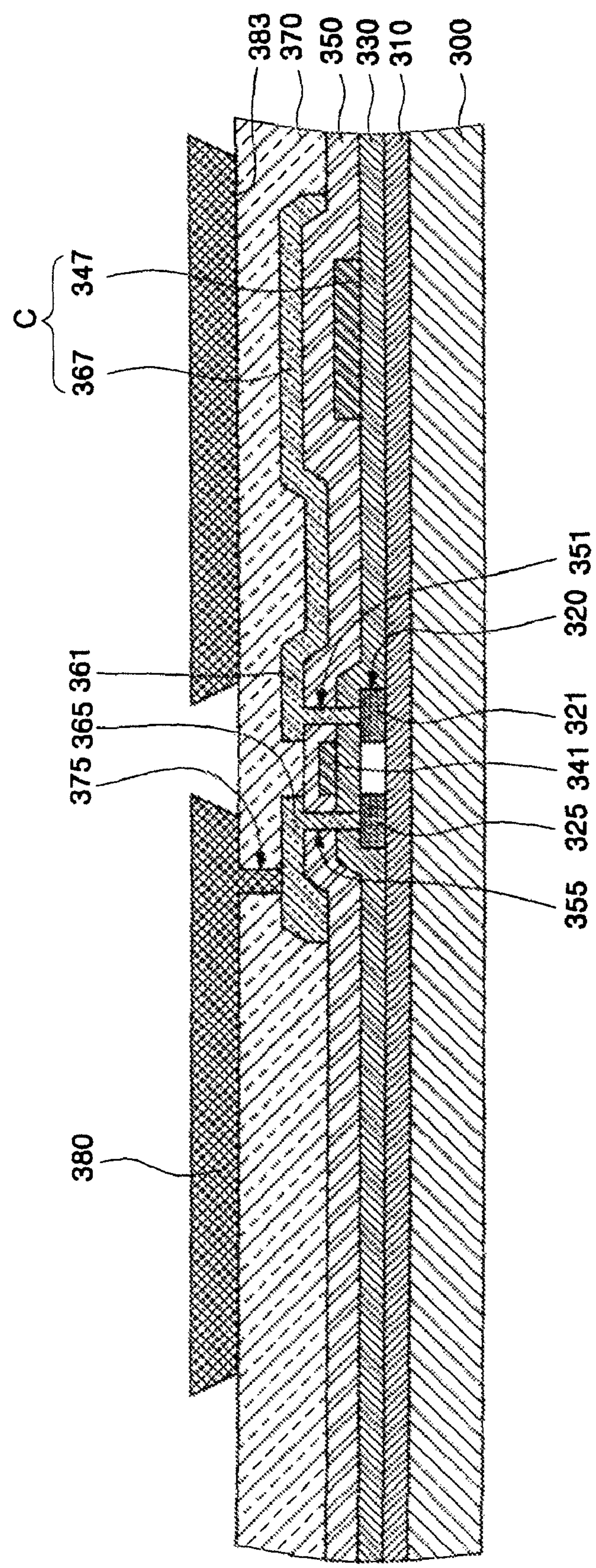
FIGS. 3A to 3C are partial cross-sectional views illustrating a process of forming a top emission OLED display according to the first exemplary embodiment of the present invention.
Figure 3B:
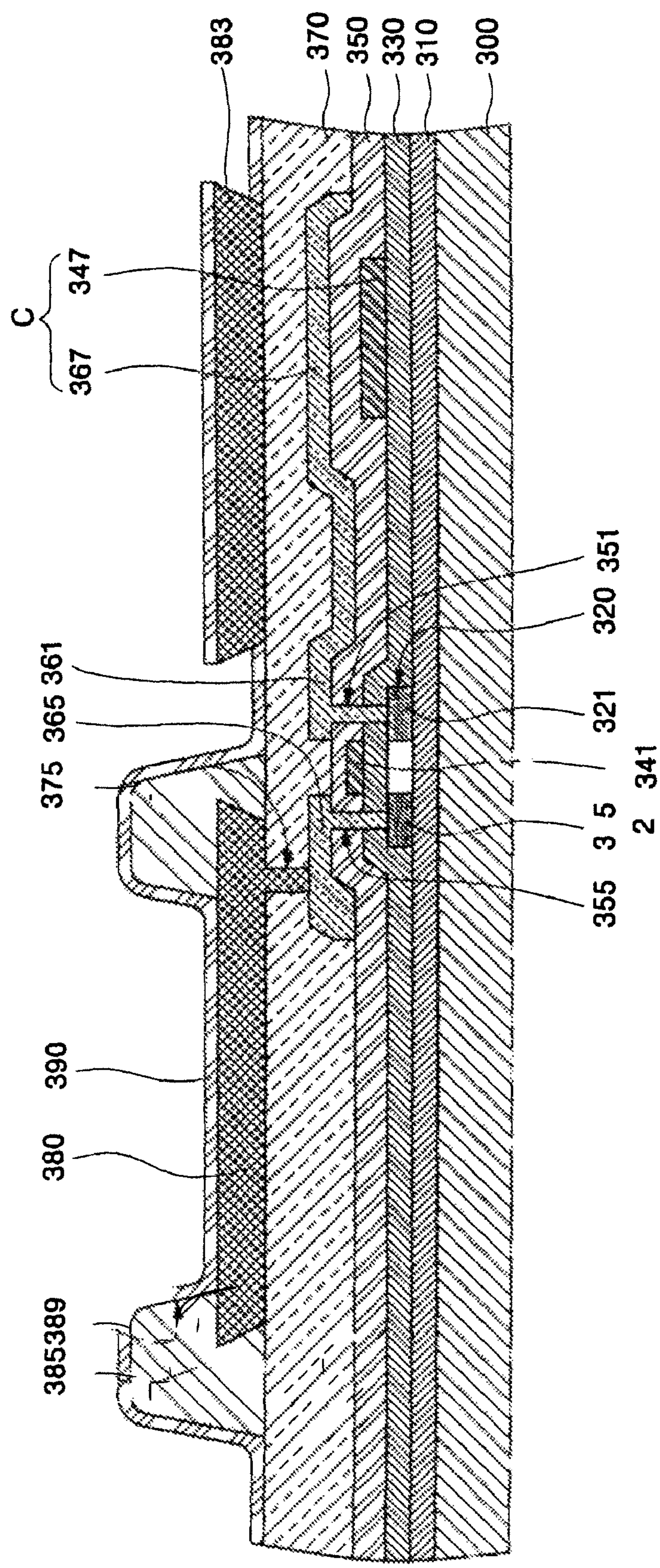
Figure 3C:
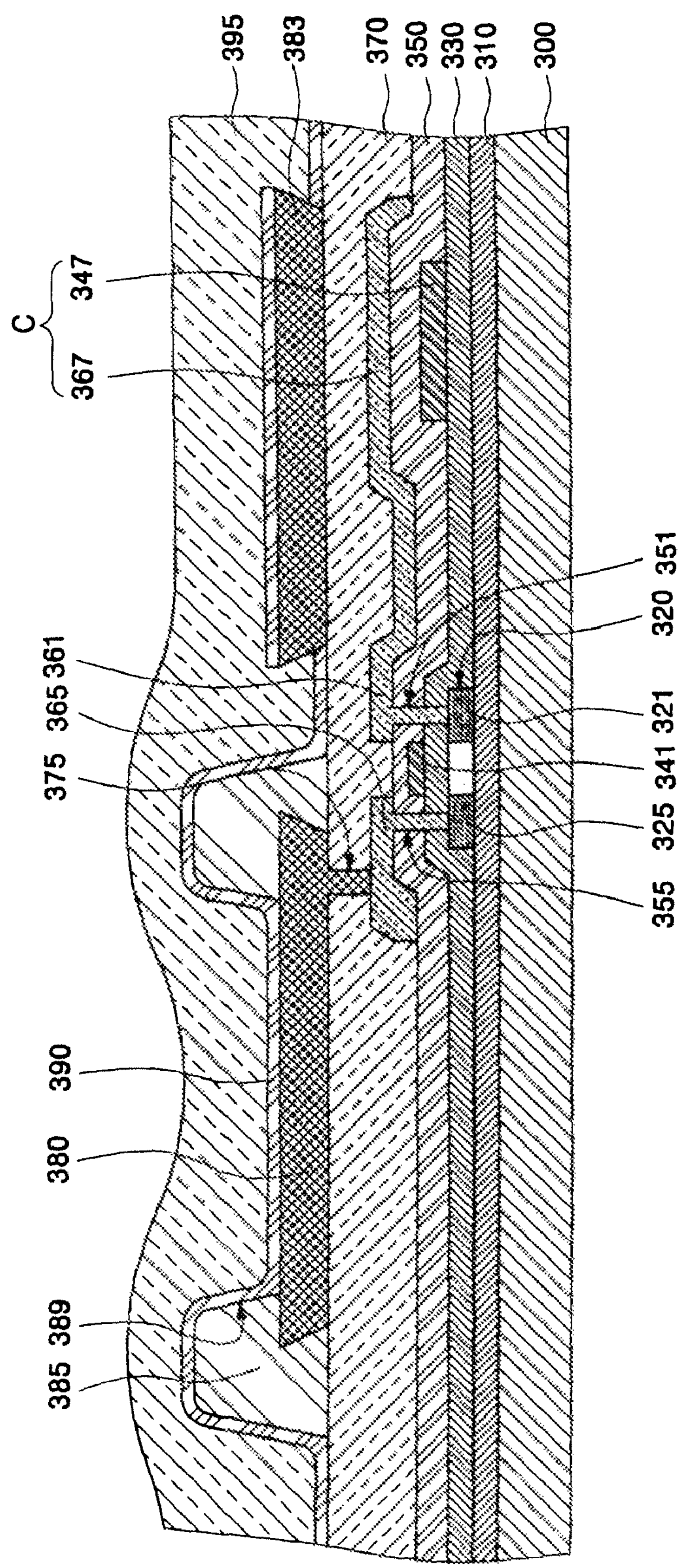

FIGS. 3A to 3C are partial cross-sectional views which illustrate a process of forming a top emission OLED display according to an exemplary embodiment of the present invention, partially showing a capacitor C, a thin film transistor, and an electroluminescent (EL) device connected to the thin film transistor.

Referring to FIG. 3A, an active layer 320 including source and drain regions 321 and 325 per each R, G, and B pixel is formed on an insulating substrate 300, on which a buffer layer 310 is formed.

After forming the active layer 320, a gate insulating layer 330 is formed on the insulating substrate 300 (i.e., on the buffer layer 310), and then a conductive material is deposited and patterned to form a gate electrode 341 and a lower electrode 347 of the capacitor.

Then, an interlayer insulating layer 350 is formed, and contact holes 351 and 355 that expose portions of the source and drain regions 321 and 325, respectively, are formed.

After forming the contact holes 351 and 355, a conductive material such as MoW is deposited and patterned to form source and drain electrodes 361 and 365 that are electrically connected to the source and drain regions 321 and 325 through the contact holes 351 and 355, respectively, and an upper electrode 367 of the capacitor connected to one of the source electrode 361 and the drain electrode 365, for example, the source electrode 361, thereby forming the thin film transistor and the capacitor.

After forming the source and drain electrodes 361 and 365 and the upper electrode 367 of the capacitor, a passivation layer 370 is formed on the entire surface of the insulating substrate 300 (i.e., on the interlayer insulating layer 350), and a via-hole 375 that exposes one of the source and drain electrodes 361 and 365, for example, the drain electrode 365, is formed.

A lower electrode 380, i.e., an island-shaped pixel electrode, which is electrically connected to the drain electrode 365 through the via hole 375, is formed and, at the same time, an auxiliary electrode 383 for preventing or reducing a voltage drop of the upper electrode to be formed hereafter is formed between the lower electrodes 380 of R, G, and B pixels.

At this time, the lower electrode 380 and the auxiliary electrode 383 should be provided with at least one edge having a taper angle of 90° or more. That is, at least one edge should be reverse tapered such that the organic layer may be separated by the auxiliary electrode 383 while forming the organic layer hereafter.

The auxiliary electrode 383 and the lower electrode 380 should be made of a conductive material having a work function larger than that of an upper electrode material to be formed in the following process. By way of example, the auxiliary electrode 383 and the lower electrode 380 should be made of Al, Mo, MoW, Ti, Ag/ITO, Ag/Mow, MoW/Al(Nd)/ITO, or a material that may be used as a reflecting layer or an anode electrode having low specific resistance in order to reduce or minimize a voltage drop of a cathode electrode and high reflectivity in order to increase reflectivity of an organic layer to be formed in the following process. Also, the lower electrode 380 and the auxiliary electrode 383 may be made of a single layer or a multilayer. Also, the lower electrode 380 and the auxiliary electrode 383 should be formed to be sufficiently thicker than the organic layer to be formed hereafter. By way of example, the auxiliary electrode 383 may be formed to have a thickness of 3,000 Å or more.

Referring to FIG. 3B, a pixel defining layer 385 with an opening 389 that exposes a portion of the lower electrode 380 is formed. At this time, the pixel defining layer 385 should not be formed on the auxiliary electrode 383, and should be formed only on an edge of the lower electrode 380.

After forming the pixel defining layer 385, an organic layer 390 is formed on the opening 389. In other words, the organic layer 390 is formed on the portion of the lower electrode exposed by the opening 389. The organic layer 390 may be composed of a plurality of layers depending upon functions thereof. In general, the organic layer 390 has a multi-layered structure including a light-emitting layer, and at least one among a hole injection layer (HIL), a hole transport layer (HTL), a hole blocking layer (HBL), an electron transport layer (ETL) and an electron injection layer (EIL).

At this time, the organic layer 390 is formed on the entire surface of the insulating substrate 300 (with other layers therebetween) and is not formed on at least one side of the auxiliary electrode 383. This is because the pixel defining layer 385 is formed at a predetermined acute angle such that the organic layer 390 may be deposited on the pixel defining layer 385, however, the auxiliary electrode 383 has a reversely tapered structure in which the taper angle of at least one edge is 90° or more and is formed to be sufficiently thicker than the organic layer 390.

Referring to FIG. 3C, an upper electrode 395 that serves as a cathode electrode is formed on the entire surface of the insulating substrate 300 (with other layers therebetween). At this time, the upper electrode 395 has a double-layered structure of a semitransparent metal layer and a transparent conductive layer, wherein the semitransparent metal layer is formed by thinly depositing a metal material having a low work function and the transparent conductive layer is formed by thickly depositing a transparent conductive material such as ITO and IZO.

Since the organic layer 390 is not formed on at least one side of the auxiliary electrode 383, the upper electrode 395 is electrically connected to at least one side of the auxiliary electrode 383. Thus, since the upper electrode 395 is electrically connected to at least one side of the auxiliary electrode 383, it is possible to prevent or reduce the voltage drop of the upper electrode 395.

Figure 4:
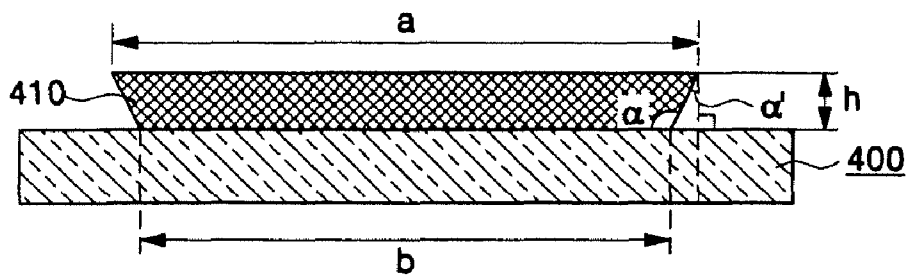
FIG. 4 is a partial cross-sectional view illustrating an auxiliary electrode for preventing or reducing a voltage drop of an upper electrode according to an exemplary embodiment of the present invention.

FIG. 4 is a partial cross-sectional view of an OLED, partially illustrating only an auxiliary electrode for preventing or reducing a voltage drop of an upper electrode according to an exemplary embodiment of the present invention.

Referring to FIG. 4, an auxiliary electrode 410 for preventing or reducing a voltage drop of an upper electrode according to an exemplary embodiment of the present invention should be provided with at least one edge having a taper angle $\alpha$ of 90° or more. By way of example, the taper angle may be 90° to 135°. That is, at least one edge has a reversely tapered structure.

This is because, when the taper angle $\alpha$ of the edge of the auxiliary electrode 410 is less than 90°, the organic layer is not cut on the side of the auxiliary electrode 410 and may go over the auxiliary electrode 410 while forming the organic layer.

Also, when the taper angle $\alpha$ of the edge of the auxiliary electrode 410 is 135° or more, the length b of the bottom surface of the auxiliary electrode 410 is much shorter than the length a of the top surface thereof so that the auxiliary electrode 410 may collapse. Also, when the OLED is driven, stress and strong electric field is generated above the edges of the auxiliary electrode 410.

In the case the auxiliary electrode 410 has a trapezoidal section, when the length of the top surface of the auxiliary electrode 410 is a, the length of the bottom surface thereof is b, the thickness of the auxiliary electrode 410 is h, and an angle obtained by subtracting 90° from an alternate angle of the taper angle $\alpha$ of the edge of the auxiliary electrode 410 is $\alpha'$, the following relationship is established between the length a of the top surface of the auxiliary electrode 410 and the length b of the bottom surface thereof.

$$b+h\tan\alpha' \leqq a \leqq b+2h\tan\alpha' \quad (0° \leqq \alpha' \leqq 45°) \qquad \text{Equation 1}$$

Since $\alpha'$ is 0° to 45°, the length a of the top surface of the auxiliary electrode 410 should be $b \leqq a \leqq b+2h$.

That is, the length a of the top surface of the auxiliary electrode 410 should be greater than or equal to the length b of the bottom surface thereof and less than or equal to the sum of twice the thickness h of the auxiliary electrode 410 and the length b of the bottom surface thereof.

FIGS. 5A to 5D are partial plan views that illustrate an OLED display with an auxiliary electrode for preventing or reducing a voltage drop of an upper electrode according to an exemplary embodiment of the present invention.

Figure 5A:
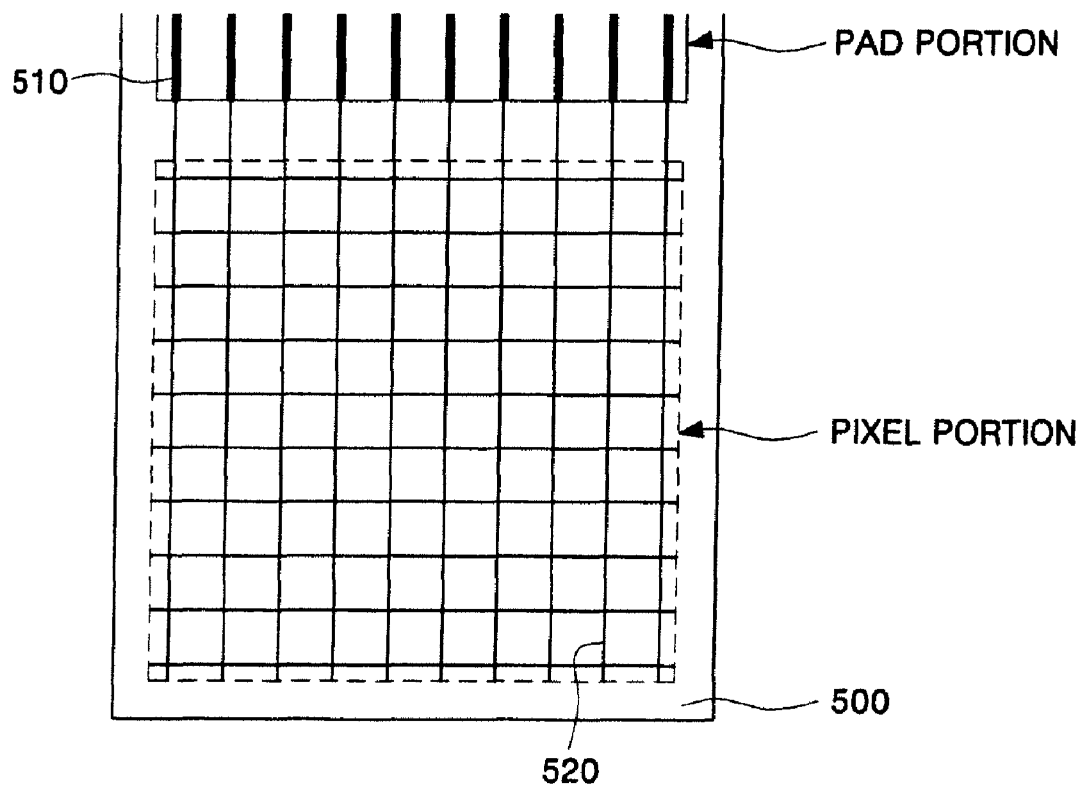
FIGS. 5A to 5D are partial plan views that illustrate an OLED display with an auxiliary electrode according to an exemplary embodiment of the present invention.

Referring to FIG. 5A, an auxiliary electrode 520 for preventing or reducing a voltage drop of an upper electrode according to an exemplary embodiment of the present invention is connected to an inlet terminal 510 of a pad portion of an insulating substrate 500.

Figure 5B:
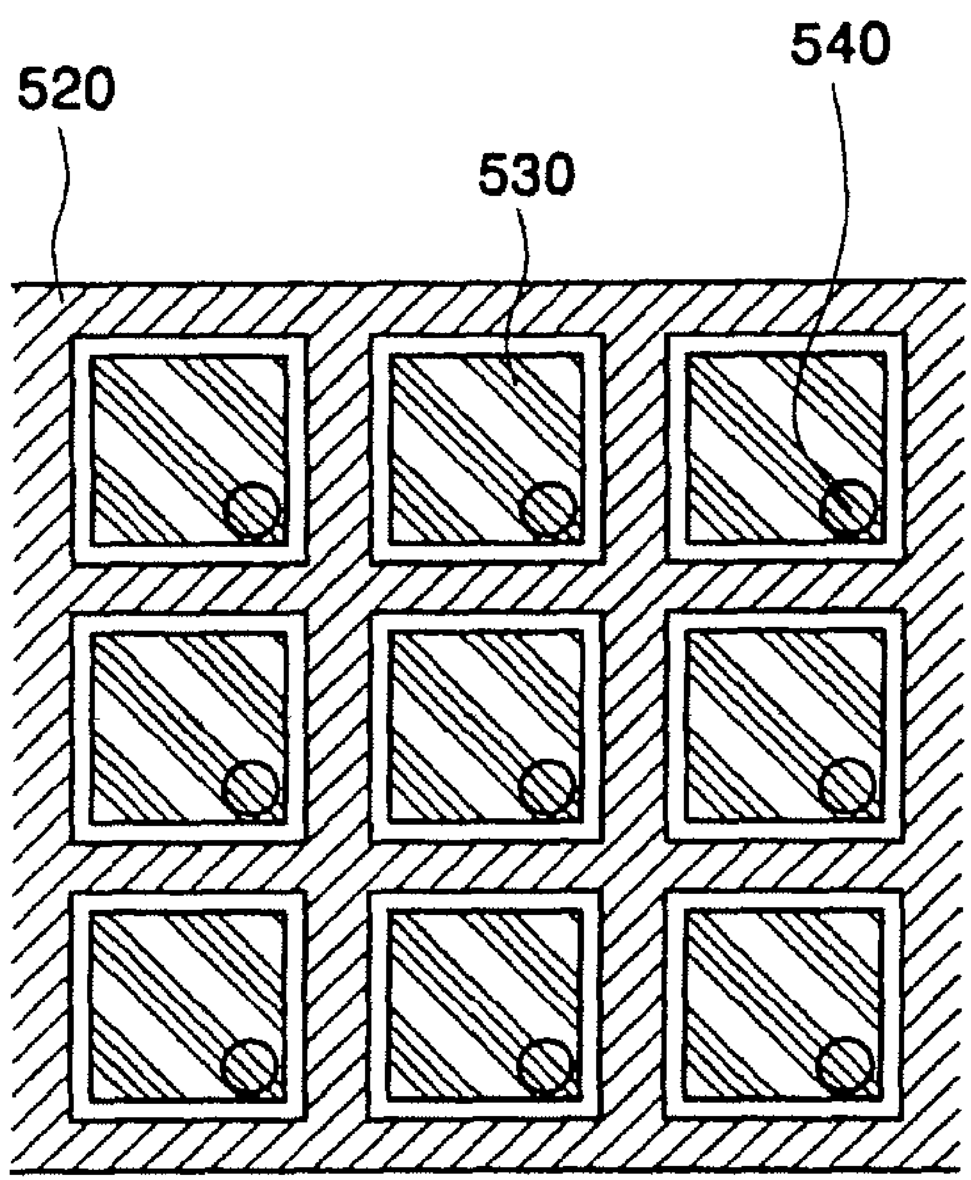

Referring to FIG. 5B, the auxiliary electrode 520 has a grid form, and a lower electrode 530, i.e., a pixel electrode, is formed in an island shape in each grid of the auxiliary electrode 520. When the auxiliary electrode 520 has the grid form, it is also possible to reduce a voltage drop of a cathode electrode.

It can be seen in FIG. 5B that a via-hole 540 is formed on each lower electrode 530.

Figure 5C:
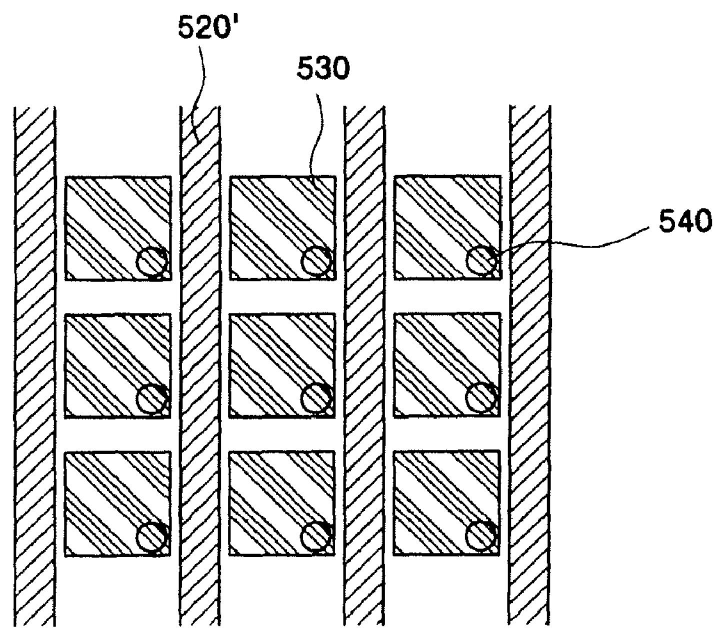

Referring to FIG. 5C, the island-shaped lower electrodes 530 are arranged as a matrix of rows and columns and an auxiliary electrode 520' is arranged as lines between the adjacent lower electrodes 530 arranged in a column direction.

Figure 5D:
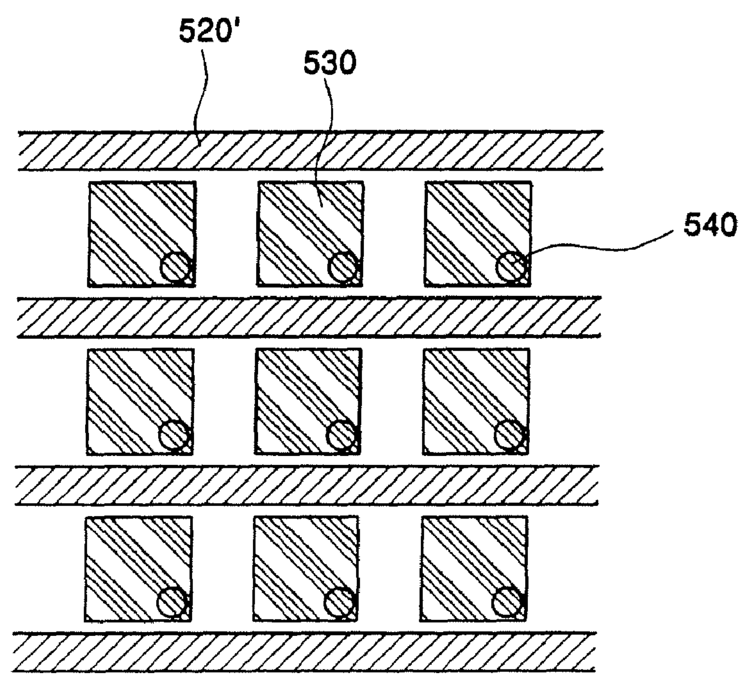

Referring to FIG. 5D, an auxiliary electrode 520" is arranged in a row direction between the adjacent island-shaped lower electrodes 530 arranged as a matrix of rows and columns.

As described above, according to the exemplary embodiment of the present invention, since the auxiliary electrode for preventing or reducing the voltage drop of the upper electrode and the lower electrode are concurrently formed, the auxiliary electrode for preventing or reducing the voltage drop of the upper electrode may be formed to prevent or reduce a voltage drop of the cathode electrode without an additional mask process. Also, it is possible to manufacture a middle-sized or large-sized OLED display by preventing or reducing the voltage drop of the cathode electrode.

As described above, according to the present invention, the auxiliary electrode for preventing or reducing the voltage drop of the upper electrode may be formed to prevent or reduce the voltage drop of the cathode electrode and to thus provide an OLED display that is capable of preventing or reducing non-uniformity of brightness and/or image characteristics.

Also, since the auxiliary electrode for preventing or reducing the voltage drop of the upper electrode and the lower electrode are concurrently formed, a cathode bus line may be formed without an additional mask process.

Also, it is possible to provide an OLED display with low power consumption by preventing or reducing the voltage drop of the cathode electrode.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. A method of fabricating an organic light emitting diode display, the method comprising:

concurrently forming an auxiliary electrode and a lower electrode on an insulating substrate including a thin film transistor, the lower electrode being electrically connected to the thin film transistor;

forming a pixel defining layer on edges of the lower electrode, thereby defining an opening which exposes a portion of the lower electrode;

forming an organic layer on the portion of the lower electrode exposed by the opening and on substantially an entire top side of the auxiliary electrode, the organic layer contacting substantially the entire top side of the auxiliary electrode from a first edge of the top side to a second edge of the top side opposite the first edge; and forming an upper electrode on an entire surface of the insulating substrate, the upper electrode being electrically connected to the auxiliary electrode.

2. The method as claimed in claim 1, wherein the auxiliary electrode prevents or reduces a voltage drop of the upper electrode and is electrically connected to the upper electrode through a lateral side of the auxiliary electrode.

3. The method as claimed in claim 1, wherein the lower electrode and the auxiliary electrode are formed thicker than the organic layer.

4. The method as claimed in claim 3, wherein the lower electrode and the auxiliary electrode are each formed having a thickness of at least 3,000 Å.

5. The method as claimed in claim 1, wherein the upper electrode is electrically connected to the auxiliary electrode through at least a lateral side of the auxiliary electrode.

* * * * *